United States Patent
Kuo

(10) Patent No.: US 8,643,394 B2
(45) Date of Patent: Feb. 4, 2014

(54) NON-REFLOW PROBE CARD STRUCTURE

(75) Inventor: Yung-Hsin Kuo, Zhubei (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 404 days.

(21) Appl. No.: 12/762,070

(22) Filed: Apr. 16, 2010

(65) Prior Publication Data

US 2011/0254577 A1    Oct. 20, 2011

(51) Int. Cl.
- *G01R 31/00*  (2006.01)
- *G01R 31/20*  (2006.01)
- *G01R 1/067*  (2006.01)

(52) U.S. Cl.
USPC ............ 324/754.18; 324/756.03; 324/754.03; 324/755.08

(58) Field of Classification Search
USPC ................. 324/754.03–754.2, 755.01–756.07
See application file for complete search history.

(56) References Cited

U.S. PATENT DOCUMENTS

| | | | |
|---|---|---|---|
| 5,821,763 A * | 10/1998 | Beaman et al. .......... | 324/754.18 |
| 5,828,226 A * | 10/1998 | Higgins et al. ........... | 324/754.07 |
| 5,974,662 A * | 11/1999 | Eldridge et al. ................. | 29/842 |
| 6,242,929 B1 | 6/2001 | Mizuta | |
| 6,729,019 B2 * | 5/2004 | Grube et al. .................... | 29/830 |
| 6,917,102 B2 | 7/2005 | Zhou et al. | |
| 7,154,284 B2 | 12/2006 | Fan et al. | |
| 7,245,137 B2 * | 7/2007 | Eldridge et al. ......... | 324/754.07 |
| 8,427,183 B2 * | 4/2013 | Mathieu et al. .......... | 324/750.16 |
| 8,476,908 B2 * | 7/2013 | Choi et al. ..................... | 324/537 |
| 8,513,962 B2 * | 8/2013 | Kiyokawa et al. ......... | 324/750.2 |
| 2007/0040565 A1 * | 2/2007 | Jayabalan et al. ............. | 324/765 |
| 2007/0063721 A1 * | 3/2007 | Dozier et al. ................. | 324/754 |
| 2008/0030214 A1 * | 2/2008 | Nguyen et al. ................ | 324/758 |
| 2008/0150558 A1 * | 6/2008 | Amemiya et al. ............ | 324/754 |
| 2008/0284458 A1 * | 11/2008 | Hosaka ......................... | 324/762 |
| 2009/0315578 A1 | 12/2009 | Lou | |

* cited by examiner

*Primary Examiner* — Joshua Benitez-Rosario

(74) *Attorney, Agent, or Firm* — Slater & Matsil, L.L.P.

(57) ABSTRACT

In accordance with an embodiment, a probe card structure comprises a base board, a connection interposer over the base board, a substrate over the connection interposer, and a fixture over the substrate securing the substrate and the connection interposer to the base board. The connection interposer comprises interposer electrodes that provide an electrical connection between electrodes on the base board and first electrodes on the substrate.

22 Claims, 8 Drawing Sheets

NON-REFLOW PROBE CARD STRUCTURE

TECHNICAL FIELD

The present disclosure relates generally to a structure for semiconductor testing and, more particularly, to a probe card structure and method of forming the probe card structure.

BACKGROUND

In the manufacturing of integrated circuits and other semiconductor devices, the circuits and devices must be tested in order to ensure that a functional device has been manufactured. These tests are usually performed by contacting a test probe card to the relevant areas of the semiconductor device, sending current to the semiconductor device and performing one or more functional tests.

A probe card typically includes a printed circuit board (PCB), substrates to redistribute contact areas, and a cobra needle head. A tester is usually coupled to the PCB to send electrical signals through the PCB to a semiconductor device that is being tested. The PCB may contact the semiconductor device through the substrate and cobra needle head. The substrate may redistribute contacts on the PCB that may have a large contact area and pitch to contacts on the cobra needle head that may be smaller in contact area and pitch, which may also be similar to the semiconductor device. The cobra needle head may then contact a semiconductor device on a wafer to undergo testing.

To attach and electrically couple the substrate to the PCB, generally, a reflow soldering process is used. However, this process generally has the disadvantageous feature that the PCB and substrate are heated in order to solder the components. The high heat level may cause damage to either component or other components on the PCB. Further, testing on the assembly may require that the assembly be subsequently processed through a reflow oven if contacts are shorted or if contacts are not properly coupled, such as an open circuit. Multiple reflow processes may cause additional problems, such as electrode pads peeling from a substrate or warpage of the substrate. Accordingly, there is a need in the art to couple a substrate to a PCB in a probe card without using a reflow soldering process and to avoid warpage of the substrate.

SUMMARY

In accordance with an embodiment, a probe card structure comprises a base board, a connection interposer over the base board, a substrate over the connection interposer, and a fixture over the substrate securing the substrate and the connection interposer to the base board. The connection interposer comprises interposer electrodes that provide an electrical connection between electrodes on the base board and first electrodes on the substrate.

In accordance with another embodiment, a probe card structure comprises a connection interposer disposed over a base board, a substrate disposed over the connection interposer, and a fixture disposed over the substrate and along a periphery of the substrate. The connection interposer comprises a bottom surface adjoining the base board and an opposite top surface, and the connection interposer also comprises electrodes extending from the bottom surface to the top surface. The substrate adjoins the top surface of the connection interposer, and the substrate has electrodes corresponding to respective electrodes of the connection interposer. The fixture secures the substrate and the connection interposer to the base board.

In accordance with a further embodiment, a method comprises providing a base board, providing a connection interposer over the base board, providing a substrate over the connection interposer, securing the substrate and the connection interposer to the base board by providing a fixture over the connection interposer and secured to the base board, and securing a test head to the base board. The connection interposer provides an electrical connection between the base board and the substrate.

BRIEF DESCRIPTION OF THE DRAWINGS

For a more complete understanding of the present disclosure, and the advantages thereof, reference is now made to the following descriptions taken in conjunction with the accompanying drawings, in which.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of other embodiments.

Embodiments will be described with respect to probe card structures. Other embodiments may also be applied, however, to other structures that may utilize a reflow process to bond components to a printed circuit board (PCB).

Figure 1:
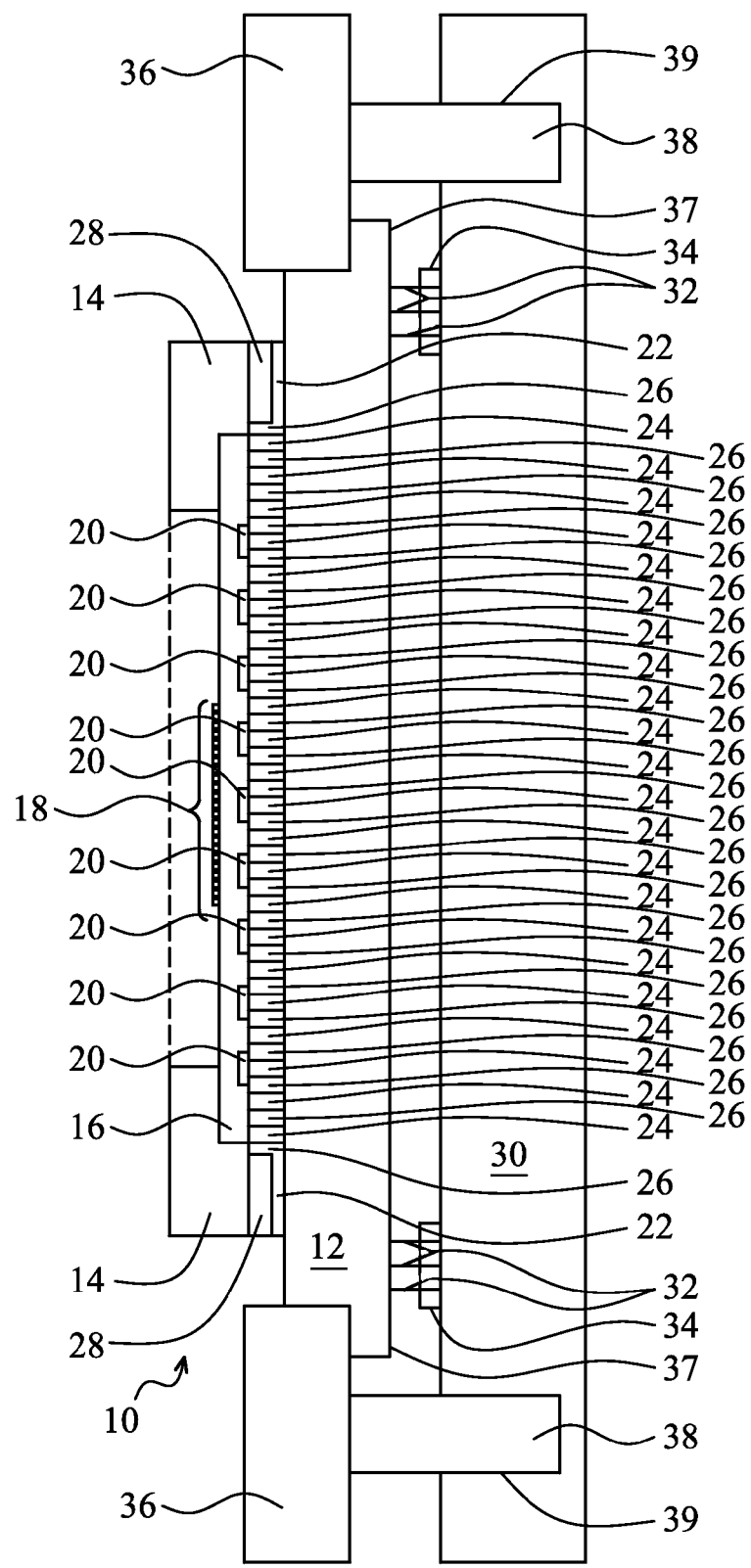
FIG. 1 is cross-sectional view of a probe card according to an embodiment.

FIG. 1 illustrates a cross-sectional view of a probe card 10 according to an embodiment. The probe card 10 comprises a printed circuit board (PCB) 12, a fixture 14, a redistribution substrate 16, fine pitch electrode pads 18, large pitch electrode pads 20, a frame 22, electrodes 24, filler material 26, and an optional isolation ring 28. The frame 22, electrodes 24, and filler material 26 compose a connection interposer between the redistribution substrate 16 and the PCB 12. The PCB 12 may be a direct docking board that couples directly to a test head 30 by pins 32 and connector block 34 and may comprise one or more additional components. Further, mounting plate 36 may be used to clamp flange 37 to the PCB 12. The flange 37 may be integral to the PCB 12 or may be a separate stiffener board adhered to the PCB 12. Mounting plate 36 may be secured to the test head 30 by mounting pins 38 inserted into openings 39 in the test head 30.

Electrodes 24 provide an electrical connection between the PCB 12 and large pitch electrode pads 20 on the bottom surface of the redistribution substrate 16. Large pitch electrode pads 20 are electrically coupled to respective fine pitch electrode pads 18 through the redistribution substrate 16. Filler material 26 stabilizes and isolates each electrode 24. The fixture 14 secures or mechanically couples the redistribution substrate 16 and the connection interposer to the PCB. The frame 22 of the connection interposer is disposed adjoining the optional isolation ring 28 or a portion of the fixture 14 proximate the PCB 12. The fine pitch electrode pads 18 on the top surface of the redistribution substrate 16 are exposed through an aperture in the fixture 14 (as shown by the dashed line). The optional isolation ring 28 may be present to isolate the fixture 14 from any electrical components on the PCB 12, and thus, may be disposed between the fixture 14 and the frame 22 or PCB 12. However, the fixture 14 may also directly adjoin the PCB 12 by either extending beyond the frame 22 and/or isolation ring 28 or by the lack of a frame and isolation ring 28.

The redistribution substrate 16, along with its fine pitch electrode pads 18 and large pitch electrode pads 20, and the PCB 12 may be formed according to any suitable method, and thus, the manner in which those components are made are omitted for brevity. The fixture 14 may comprise stainless steel or other suitable material. Further, it may be formed by cutting a sheet of steel in an appropriate pattern. The frame 22 may be an elastic material. The filler material 26 of the connection interposer may comprise an elastic, flexible, non-conductive adhesive material, such as silicone rubber, a polymer based material, or the like. The flexible nature of the material may allow for compliance or compensation when the fixture 14 applies a force to the interposer and redistribution substrate 16 by securing the components to the PCB 12. The electrodes 24 may be resilient structures, such as helical springs embedded in the filler material 26, conductive pins or columns, or the like, and may comprise a nickel alloy or other suitable conductive materials. The connection interposer may be obtained from commercial vendors, such as Winway Technologies. The isolation ring may be made from a glass reinforced epoxy, such as Flame Retardant 4 (FR4), from a polyimide based material, or from any other isolating material.

Figure 2A:
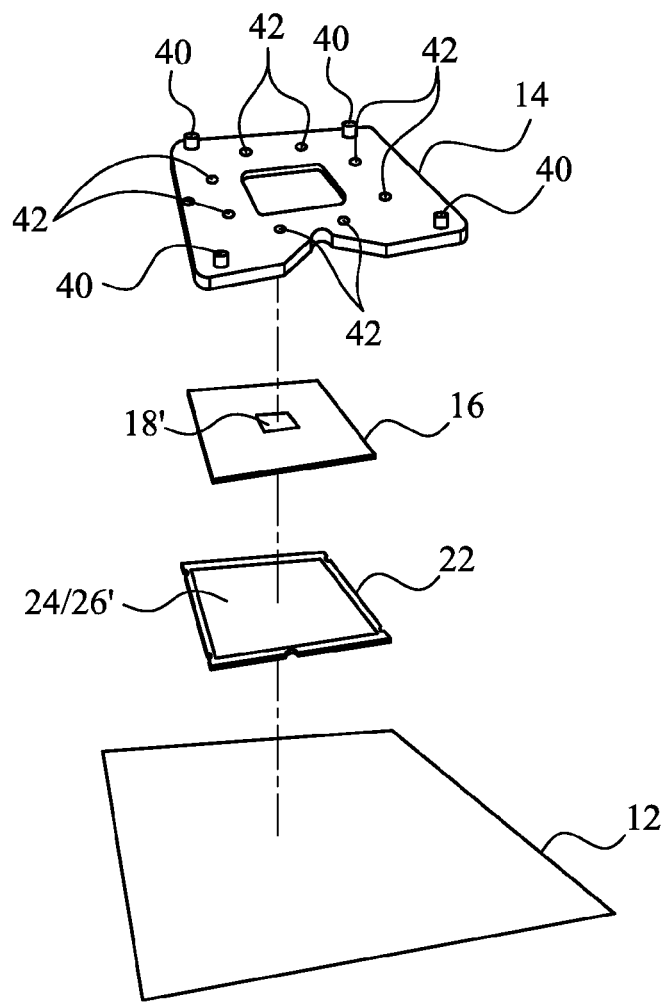
FIG. 2A is a three-dimensional view of the order of assembling the components of the probe card in FIG. 1.
Figure 2B:
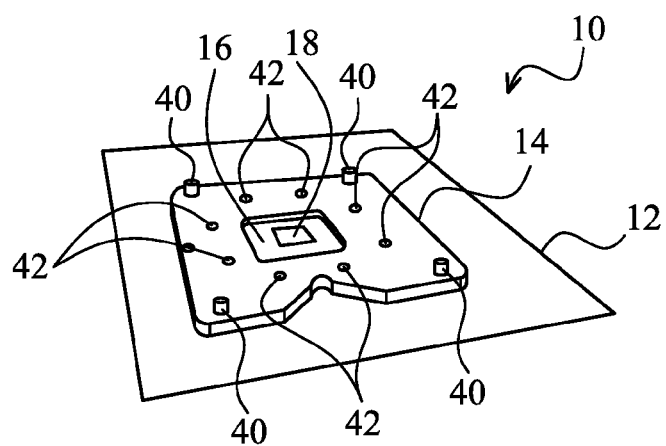
FIG. 2B is a three-dimensional view of the assembled probe card in FIG. 1.

FIG. 2A shows a three-dimensional view of the order of assembling the components of the probe card 10. As shown, the connection interposer with the electrode and filler material area 24/26' is placed on and adjoining the PCB 12. The isolation ring 28 is placed over the frame 22 of the connection interposer and surrounding the electrodes and filler material area 24/26'. The redistribution substrate 16 is then placed over and adjoining the electrodes and filler material area 24/26'. The fixture 14 is then placed over the redistribution substrate 16 such that an aperture in the center of the fixture 14 exposes the fine pitch electrode area 18'. Screws 40 are used to secure the fixture 14 to the PCB 12. In this manner, the fixture 14 secures the connection interposer and the redistribution substrate 16 in their respective proper places. Screw holes 42 may be used to attach a cobra needle head to the fixture 14 such that the cobra needle head contacts the fine pitch electrodes 18 when the probe card 10 is in use. FIG. 2B shows a three-dimensional view of the assembled probe card 10.

Although FIGS. 2A and 2B do not depict the test head 30, it may be secured to probe card 10 after probe card 10 is assembled. The pins 32 and connector blocks 34 may be aligned with their respective connections on the PCB 12. Then, the mounting plate 36 may be placed over the PCB 12, and the mounting pins 38 of the mounting plate 36 may be secured into openings 39 of the test head 30. Subsequent figures do not depict a test head, but embodiments such as those in the following figures may include a test head directly connected to a PCB similar to the test head 30 discussed above.

Figure 3:
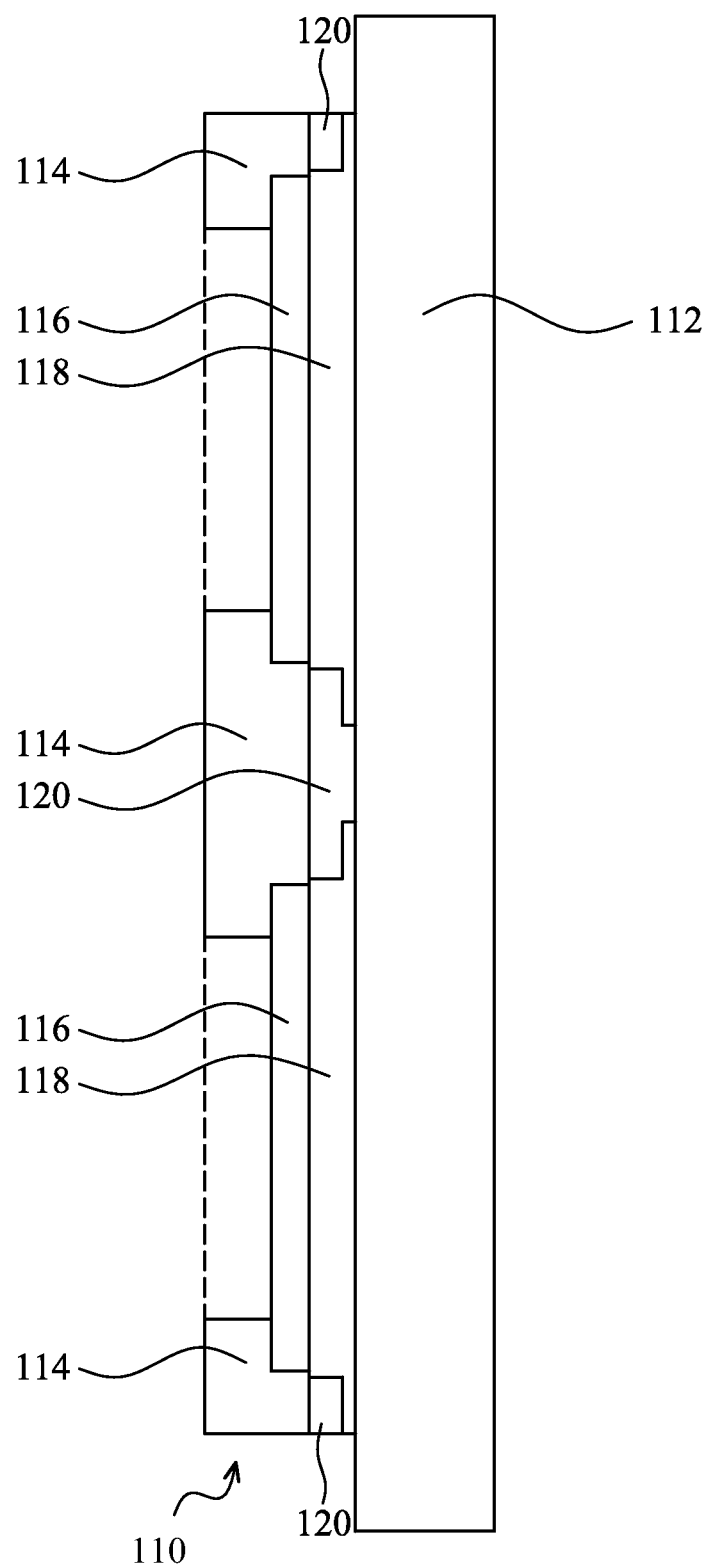
FIG. 3 is a cross-sectional view of a probe card for testing multiple devices according to an embodiment.

FIG. 3 illustrates a probe card 110 for testing multiple devices according to an embodiment. The probe card 110 comprises a dual aperture fixture 114, redistribution substrates 116, connection interposers 118, an optional dual isolation ring 120, and a PCB 112. One connection interposer 118 is disposed between each redistribution substrate 116 and the PCB 112. Each connection interposer 118 and redistribution substrate 116 comprises similar components as the connection interposer and redistribution substrate 16, respectively, discussed above with respect to FIG. 1, although those components are not specifically illustrated. The connection interposers 118 provide electrical contacts between the PCB 112 and the redistribution substrates 116. Further, a single interposer may be used with multiple redistribution substrates 116.

Figure 4A:
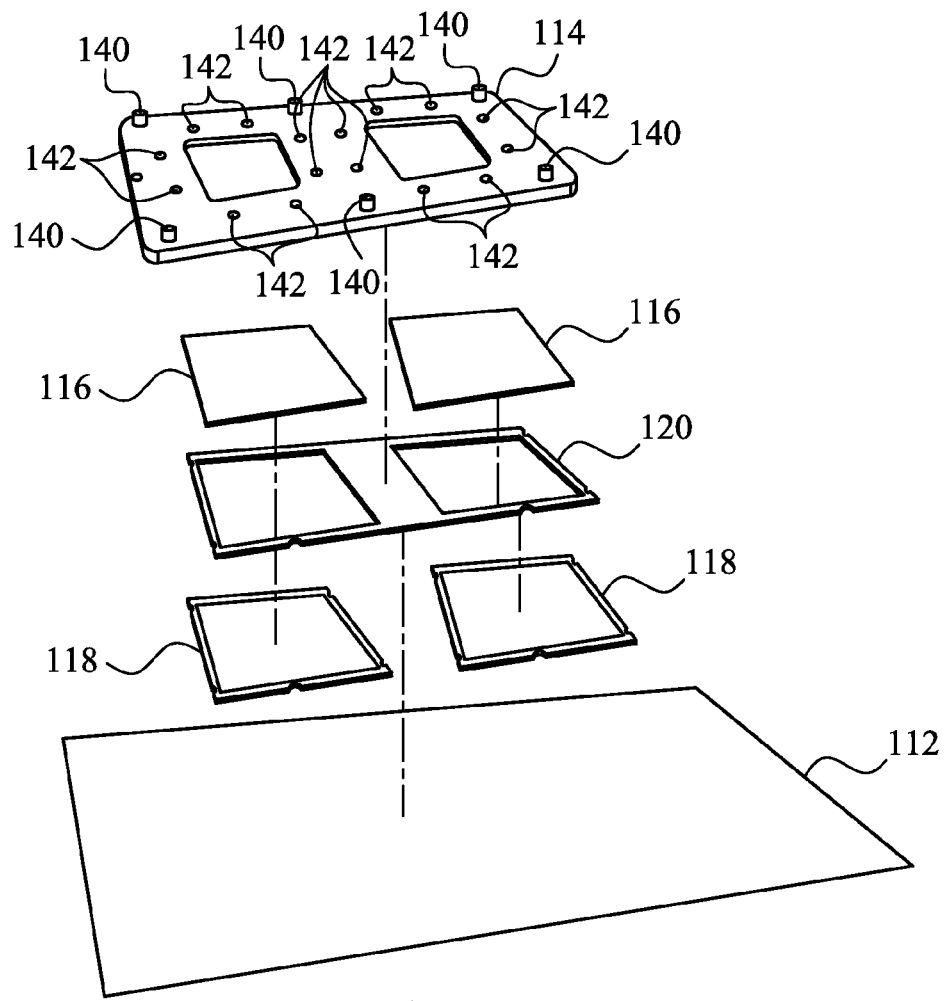
FIG. 4A is a three-dimensional view of the order of assembling the components of the probe card in FIG. 3.
Figure 4B:
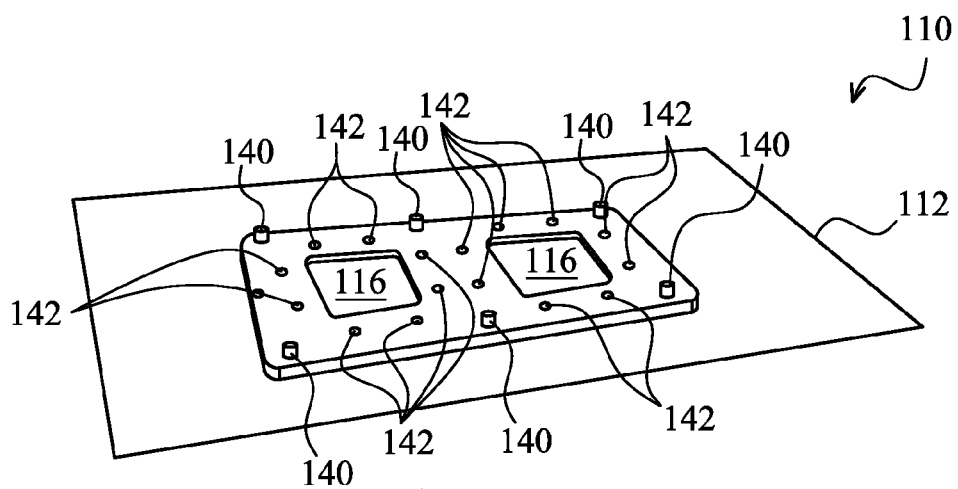
FIG. 4B is a three-dimensional view of the assembled probe card in FIG. 3.

FIG. 4A shows a three-dimensional view of the order of assembling the components of the probe card 110, similar to FIG. 2A, and FIG. 4B shows a three-dimensional view of the assembled probe card 110. Similar to FIG. 2B, FIG. 4B also illustrates screws 140 that mechanically secure the components to the PCB 112, and illustrates screw holes 142 for attaching a cobra needle head during use.

Probe cards as described above may be assembled without the need for the reflow process in conventional probe card structures. This may avoid the need to heat the PCB, and thus, components on the PCB, to elevated temperatures that are typically necessary for the reflow process. For example, a typical reflow process may require the work environment temperature to be approximately 250° C., whereas embodiments may be assembled at room temperature. Without the elevated temperatures, components may be less likely to become defective or damaged.

Further advantages may be realized by embodiments, such as those described above. The assembly of probe cards may be easier and faster than conventional reflow assembly processes. For example, the assembly may decrease from three to five days for a reflow process to approximately two days. Further, if a component of the structure becomes damaged or defective, it may be easily replaced, for example, by simply removing screws or other securing means to disassemble the structure, replacing the damaged component, and re-assembling the probe card.

Also, if a test head is directly coupled to a probe card as discussed above, more advantages may be realized. For example, a probe card directly coupled to a test head may have increased bandwidth compared to probe cards that have additional components disposed interconnected between the test head and probe card. Further, a PCB in a probe card may have more space for mounting additional components.

Figure 5:
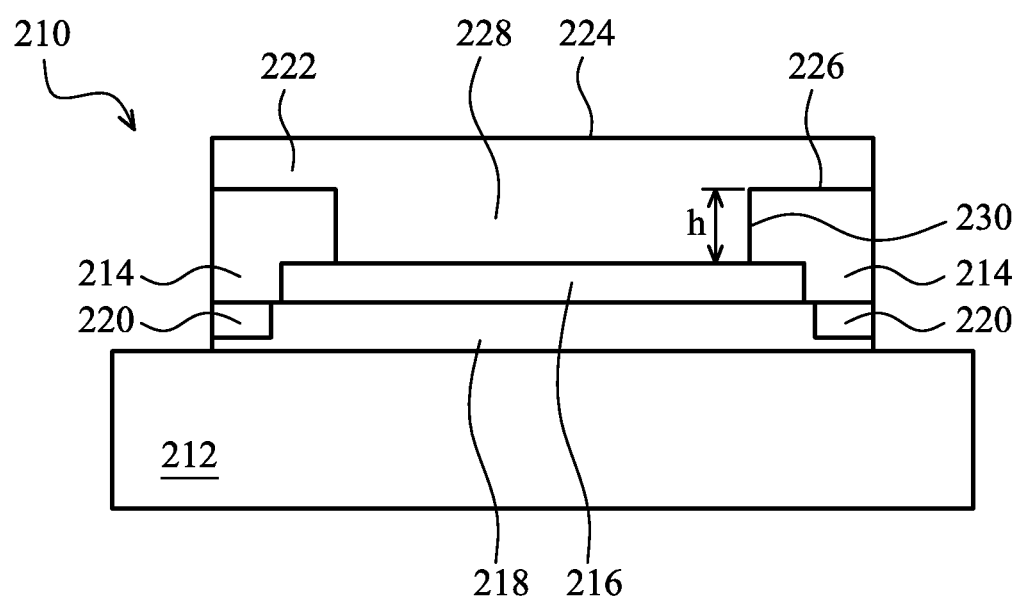
FIG. 5 is a cross-sectional view of a probe card and cover according to another embodiment.

FIG. 5 illustrates a probe card 210 and cover 222 according to another embodiment. The probe card 210 comprises a PCB 212, a fixture 214, a redistribution substrate 216, a connection interposer 218, and an optional isolation ring 220, similar to FIG. 1. FIG. 5 further illustrates a cover 222 with a top surface 224, a bottom surface 226, and a spacer 228 extending from the bottom surface 226.

Figure 6A:
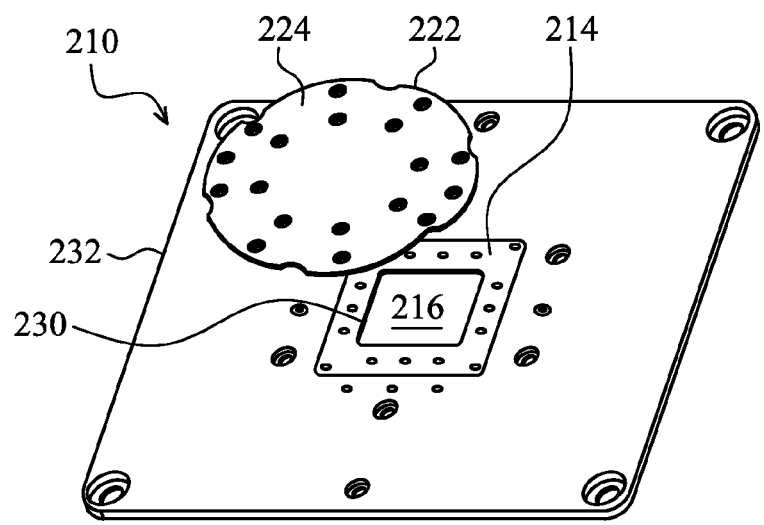
FIG. 6A is a three-dimensional view of the probe card in FIG. 5 with the bottom surface of the cover facing the probe card.
Figure 6B:
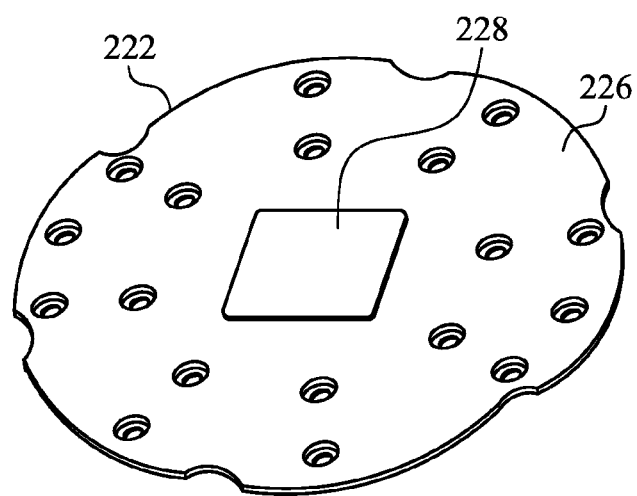
FIG. 6B is a three-dimensional view of the cover in FIG. 5 in a position where the bottom surface is up.

FIG. 6A depicts in a three-dimensional view the probe card 210 with the bottom surface 226 of the cover 222 facing the probe card 210. In FIG. 6A, the probe card 210 further comprises a guard 232 surrounding the peripheral edges of the fixture 214 and on the PCB 212 (not illustrated in FIG. 6A). The guard 232 may be a stainless steel based metal and may be secured to the PCB 212 by screws. The cover 222 is shown in FIG. 6A in a position where the top surface 224 is up. The cover 222 may be secured to the probe card 210 when the probe card 210 is not in use. The cover 222 may be secured by screws inserted into the fixture 214, the guard 232, the PCB 212, or any combination thereof. When the cover 222 is secured to the probe card 210, top surface 224 is facing away from the probe card 210. FIG. 6B is another view of the cover 222 in a position where the bottom surface 226 is up. On the bottom surface 226 is a spacer 228 that extends out from the bottom surface 226.

The spacer 228 fits into aperture 230 when the cover 222 is secured to the probe card 210, as illustrated in FIG. 5. Thus, the spacer 228 may have a surface area parallel to the bottom surface 226 that matches a surface area of the redistribution substrate 216 that is exposed through the aperture 230. However, the surface area of the spacer 228 may have dimensions slightly smaller than the exposed surface area of the redistribution substrate 216, such as by approximately 1 to approximately 2 millimeters or less. The spacer 228 may extend away from the bottom surface 226 a distance that is equal to the height h of a sidewall in the aperture 230 of the fixture 214. In some instances, the spacer 228 may need to extend away a further distance if, for example, the cover 222 is to be secured to a guard 232 that extends to a height away from the PCB that is greater than the height of the fixture 214. However, some variation of the distance may occur. The spacer 228 may therefore contact or almost contact the top surface of the redistribution substrate 216 when the cover is secured to the probe card 210.

By securing the cover 222 to the probe card 210 when the probe card 210 is not in use, the cover 222 may prevent some warping of the redistribution substrate 216. Once the fixture 214 tightly secures the redistribution substrate 216, the redistribution substrate 216 may be prone to warping which may cause open electrical contacts between the redistribution substrate 216 and any underlying connection interposer. For example, the redistribution substrate 216 may warp such that the center extends away from the connection interposer by between approximately 5 and 8 mils (0.127 and 0.2032 mm). If the cover 222 is used, warping may be minimized, such as to approximately 2 to 3 mils (0.0508 to 0.0762 mm), or prevented. Thus, electrical connections between the redistribution substrate 216 and the connection interposer may be more reliable.

Figure 7:
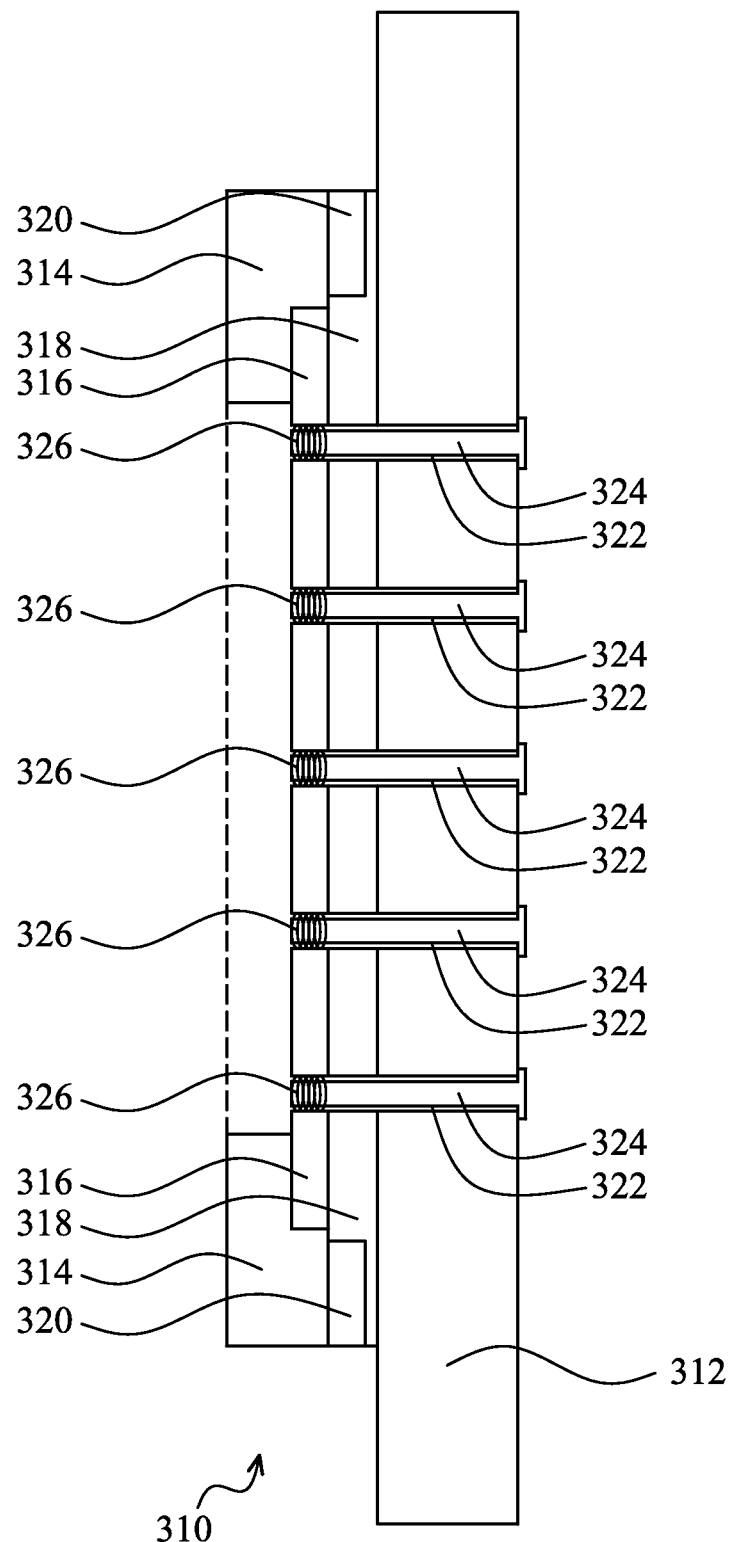
FIG. 7 is cross-sectional view of a probe card with improved co-planarity according to another embodiment.

FIG. 7 is a probe card 310 with improved co-planarity according to another embodiment. The probe card 310 comprises a fixture 314, a redistribution substrate 316, a connection interposer 318, an optional isolation ring 320, and a PCB 312, similar to FIG. 1. However, the PCB 312, redistribution substrate 316, and connection interposer 318 have areas in which no electrode, pad, or pin exists. These areas are skip device under test (DUT) areas. Through-holes 322 exist in or around the skip DUT areas and penetrate through the PCB 312, redistribution substrate 316, and connection interposer 318. In the through-holes 322 in the redistribution substrate 316 are threads 326 into which fit screws 324. The probe card 310 may be assembled similar to FIG. 2A, except screws 324 are inserted from the back of the PCB 312 through the through-holes 322 of the PCB 312, connection interposer 318, and redistribution substrate 316 and are tightened by the threads 326 in the redistribution substrate 316. The threads 326 may be embedded sockets with inner threads or a nut with inner threads pre-mounted within the substrate. Rivets or other similar devices may be used in the place of screws and threads.

Figure 8A:
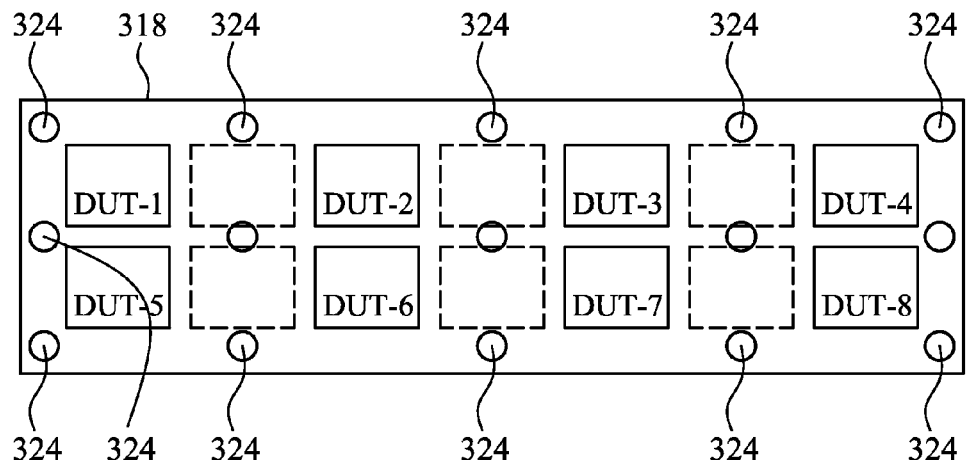
FIGS. 8A and 8B are plan views of the connection interposer and the redistribution substrate, respectively, in FIG. 7.
Figure 8B:
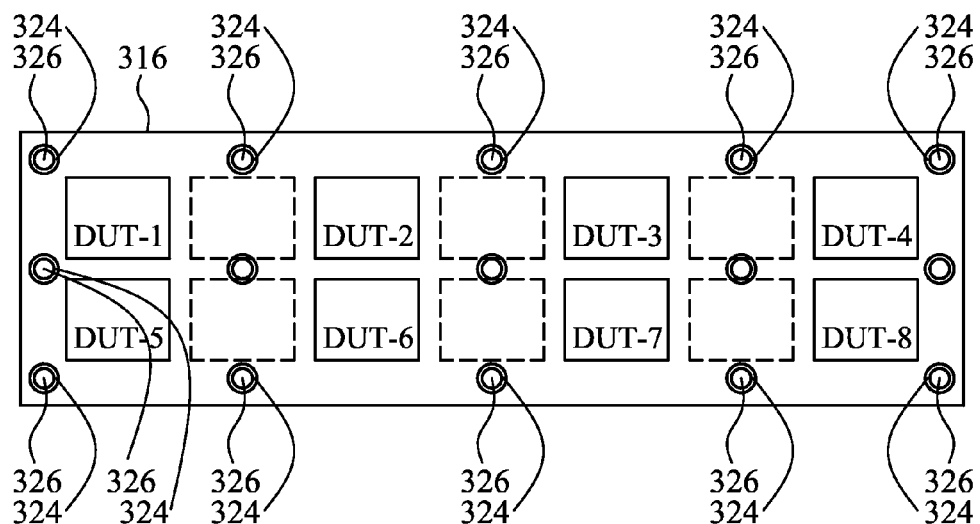

FIGS. 8A and 8B depict plan views of the connection interposer 318 and the redistribution substrate 316, respectively, according to an illustrative embodiment. As can be seen from the figures, the skip DUT areas (identified by the dashed lines) are formed in columns interposed between columns of active DUT areas, labeled DUT-1, DUT-2, etc. Thus, the columns of skip DUT areas and active DUT areas alternate. The through-holes 324 are formed in or around the skip DUT areas. Threads 326 are formed in the through-holes 324 in the redistribution substrate 316, as shown in FIG. 8B.

Using the embodiments in FIGS. 7 through 8B, the co-planarity of the redistribution substrate 316 may be improved, similar to the embodiment in FIGS. 5 through 6B. In these embodiments, the warping of the redistribution substrate 316 may be minimized to, for example, approximately 2 to 3 mils (0.0508 to 0.0762 mm). Thus, the electrical connections between the PCB 312 and the redistribution substrate 316 may be more reliable.

Although the present embodiments and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present embodiments. Accordingly, the appended claims are intended to include within their scope such processes, machines, manufacture, compositions of matter, means, methods, or steps.

What is claimed is:

1. A probe card structure comprising:
   a base board;
   a connection interposer over the base board; the connection interposer comprising interposer electrodes;
   a substrate over the connection interposer, the interposer electrodes providing respective electrical connection between base electrodes on the base board and first substrate electrodes on the substrate; and
   a fixture over the substrate fixedly securing the substrate and the connection interposer to the base board, the fixture consisting essentially of a single rigid component over the substrate with at least one connector to the base board.

2. The probe card structure of claim 1, wherein the substrate is a redistribution substrate including the first substrate electrodes on a first surface adjoining the connection interposer and second substrate electrodes on a second surface opposite the first surface, wherein the first substrate electrodes have a larger pitch than the second substrate electrodes, and wherein a portion of the substrate is exposed through an aperture in the fixture, the portion of the redistribution substrate comprising the second electrodes.

3. The probe card structure of claim 1 further comprising a cover over the substrate and secured to the base board, the fixture, or a combination thereof, wherein the cover comprises a spacer extending into an aperture in the fixture, the aperture exposing a portion of the substrate.

4. The probe card structure of claim 1, wherein the fixture extends along peripheries of the connection interposer and the substrate.

5. The probe card structure of claim 1, wherein each of the interposer electrodes extends from a bottom surface of the connection interposer to a top surface of the connection interposer, and the connection interposer further comprises an elastic isolation material disposed between the interposer electrodes.

6. The probe card structure of claim 5, wherein the elastic isolation material comprises silicone rubber or a polymer based material.

7. The probe card structure of claim 1, wherein each of the interposer electrodes comprises a resilient structure.

8. The probe card structure of claim 7, wherein the resilient structure comprises a helical spring, a conductive pin, or a conductive column.

9. The probe card structure of claim 1 further comprising a probe head that comprises needles over and electrically coupled to the substrate.

10. The probe card structure of claim 1 further comprising:
an additional connection interposer over the base board; and
an additional substrate over the additional connection interposer, wherein the fixture is over the additional substrate fixedly securing the additional substrate and the additional connection interposer to the base board, the fixture having a first aperture and a second aperture, the first aperture being separate from the second aperture, the substrate being exposed through the first aperture, and the additional substrate being exposed through the second aperture.

11. The probe card structure of claim 1 further comprising a test head directly electrically coupled to the base board, wherein a mounting plate over the base board secures the test head to the base board.

12. The probe card structure of claim 1 comprising a securing mechanism extending through the base board the connection interposer and penetrating the substrate, the securing mechanism penetrating the substrate in an area directly below an exposed surface of the substrate and fixedly securing the substrate to the base board.

13. The probe card structure of claim 1, wherein a portion of the fixture directly adjoins the based board.

14. The probe card structure of claim 1, wherein the substrate having a top surface that comprises active device under test (DUT) areas and skip DUT areas, the active DUT areas and the skip DUT areas alternating along a direction, each of the active DUT areas comprising a plurality of the electrodes of the substrate, the skip DUT areas and the active DUT areas having a same area size.

15. A probe card structure comprising:
a connection interposer disposed over a base board, wherein the connection interposer comprises a bottom surface adjoining the base board and an opposite top surface, and wherein the connection interposer comprises electrodes extending from the bottom surface to the top surface;
a substrate disposed over the connection interposer, wherein the substrate adjoins the top surface of the connection interposer, the substrate having electrodes corresponding to respective electrodes of the connection interposer; and
a fixture disposed over the substrate and along a periphery of the substrate, wherein the fixture fixedly secures the substrate and the connection interposer to the base board, the fixture consisting essentially of a single rigid component over the substrate and along the periphery of the substrate with at least one connector to the base board.

16. The probe card structure of claim 15 further comprising:
an additional connection interposer disposed over the base board; and
an additional substrate disposed over the connection interposer, wherein the fixture secures the additional substrate and the additional connection interposer to the base board.

17. The probe card structure of claim 15 further comprising a cover disposed over the substrate, wherein a portion of the substrate is exposed through an aperture in the fixture, and the cover comprises a spacer that extends into the aperture to a depth of the aperture.

18. The probe card structure for claim 15, wherein the connection interposer and the base board have a through-hole penetrating in a direction perpendicular to the bottom surface, wherein a securing device is in the through-hole securing the substrate and the connection interposer to the base board.

19. A method comprising:
providing a base board;
providing a connection interposer over the base board;
providing a substrate over the connection interposer, wherein the connection interposer provides an electrical connection between the base board and the substrate; and
fixedly securing the substrate and the connection interposer to the base board by providing a fixture over the substrate and the connection interposer and secured to the base board, the fixture consisting essentially of a single rigid component over the substrate with at least one connector to the base board; and
securing a test head to the base board.

20. The method of claim 19, wherein no soldering process is used to secure the substrate to the base board.

21. The method of claim 19 further comprising securing a cover the fixture, wherein the cover extends into a depth of an aperture of the fixture, a surface of the substrate being exposed through the aperture.

22. The method of claim 21 further comprising removing the cover and adjoining a needle head to the substrate.

* * * * *

UNITED STATES PATENT AND TRADEMARK OFFICE
CERTIFICATE OF CORRECTION

| | |
|---|---|
| PATENT NO. | : 8,643,394 B2 |
| APPLICATION NO. | : 12/762070 |
| DATED | : February 4, 2014 |
| INVENTOR(S) | : Yung-Hsin Kuo |

It is certified that error appears in the above-identified patent and that said Letters Patent is hereby corrected as shown below:

In the Claims

In Col. 6, line 48, claim 1, delete "connection" and insert --connections--.
In Col. 6, line 64, claim 2, after "second" insert --substrate--.
In Col. 7, line 39, claim 12, after "claim 1" insert --further--.
In Col. 7, line 40, claim 12, after "base board" insert --and--.

Signed and Sealed this
Fifteenth Day of April, 2014

Michelle K. Lee
*Deputy Director of the United States Patent and Trademark Office*